United States Patent [19]
Yamanaka

[11] 4,064,532
[45] Dec. 20, 1977

[54] SOLID STATE COLOR CAMERA
[75] Inventor: Seisuke Yamanaka, Mitaka, Japan
[73] Assignee: Sony Corporation, Tokyo, Japan
[21] Appl. No.: 613,519
[22] Filed: Sept. 15, 1975
[30] Foreign Application Priority Data
Sept. 18, 1974 Japan .............................. 49-107499
Dec. 26, 1974 Japan .................................. 49-2602
[51] Int. Cl.² .............................................. H04N 9/07
[52] U.S. Cl. ......................................... 358/44; 357/24
[58] Field of Search ...................... 358/41, 43, 44, 47; 357/24, 30-32

[56] References Cited
U.S. PATENT DOCUMENTS
B 502,289  1/1976  Chai ..................................... 358/41
3,591,268  7/1971  Neale ................................. 358/44 X
3,647,948  3/1972  Eto et al. .......................... 358/44 X FOREIGN PATENT DOCUMENTS
1,092,881  11/1967  United Kingdom .................. 358/44

Primary Examiner—John C. Martin
Assistant Examiner—Mitchell Saffian
Attorney, Agent, or Firm—Hill, Gross, Simpson, Van Santen, Steadman, Chiara & Simpson

[57] ABSTRACT

A solid state color television camera which handles a composite color video signal consisting of interlaced full field informations. The color camera employs a charge coupled device the picture elements of which are selected to be in a shifted relation by 1/2 of alignment pitch in the vertical direction between odd and even fields, and in which a color filter to be disposed between an object and the charge coupled device is arranged in its construction such that the charge coupled device is capable of supplying output video signals of the same color components between odd and even fields.

11 Claims, 32 Drawing Figures

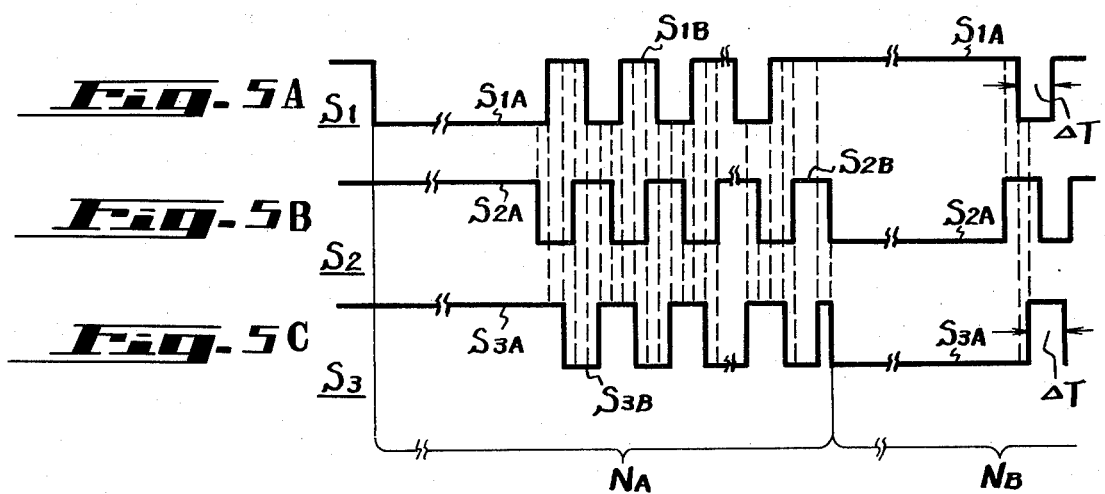
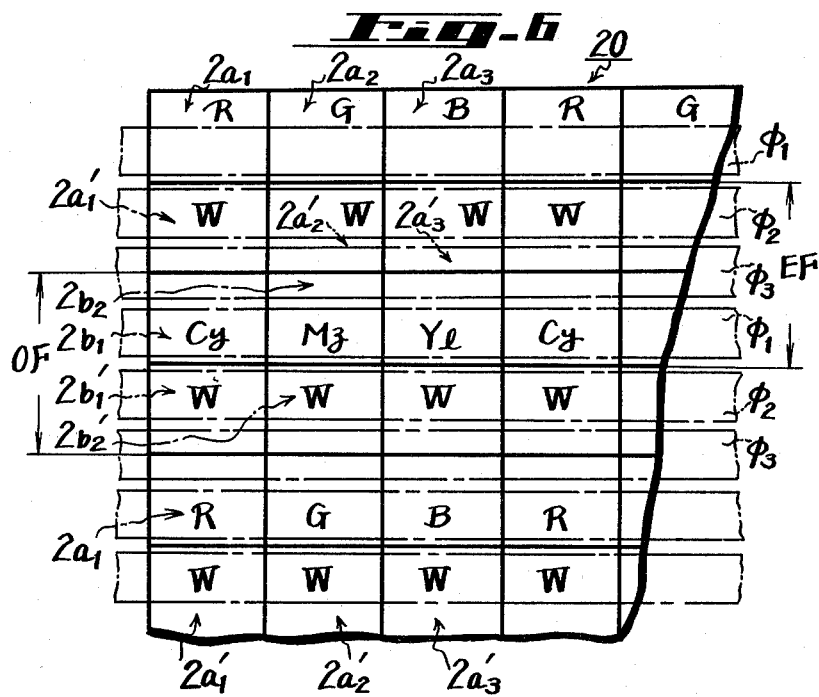

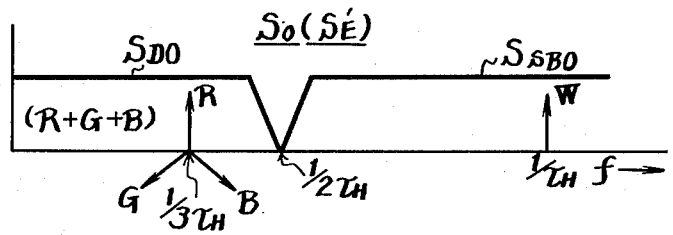
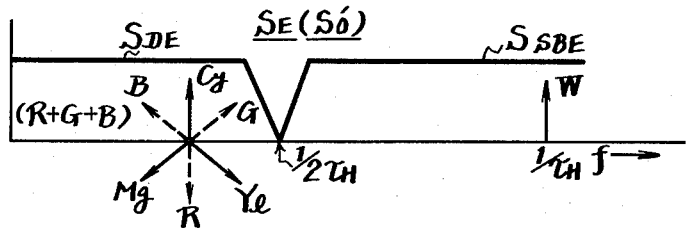
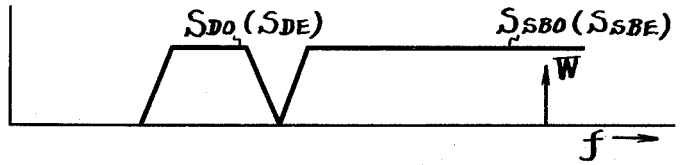
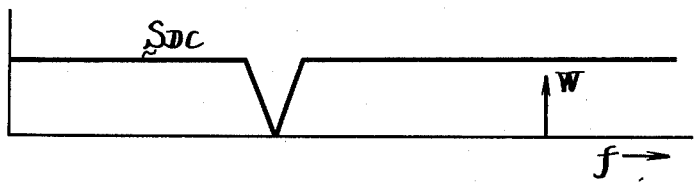
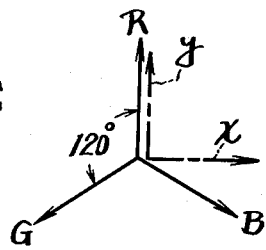
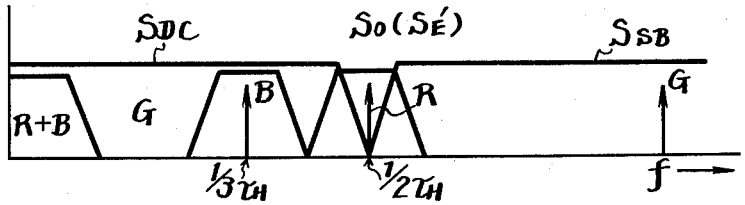
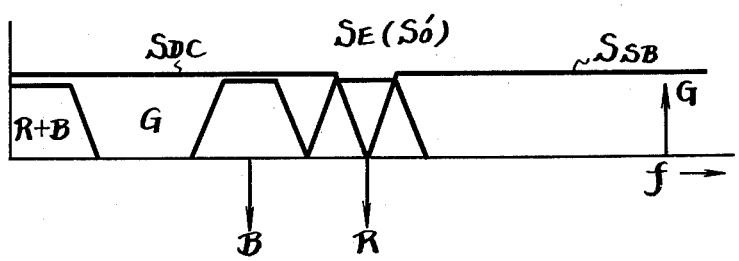

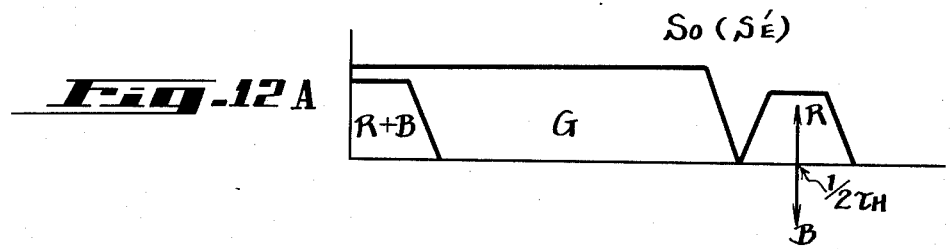
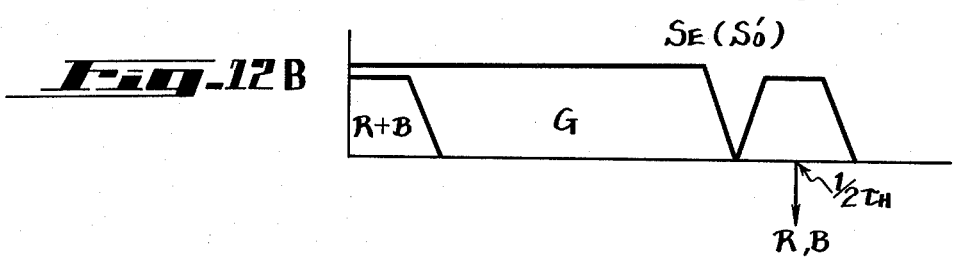
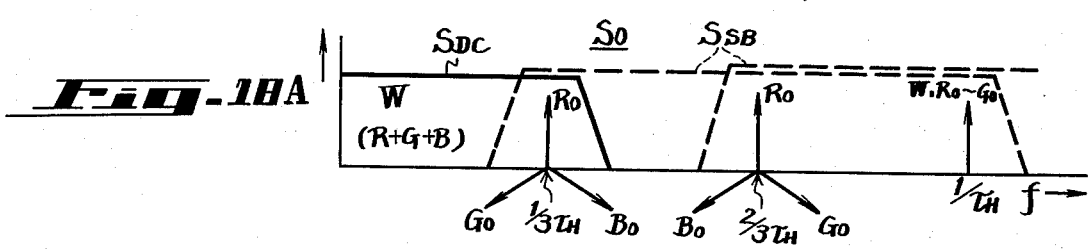
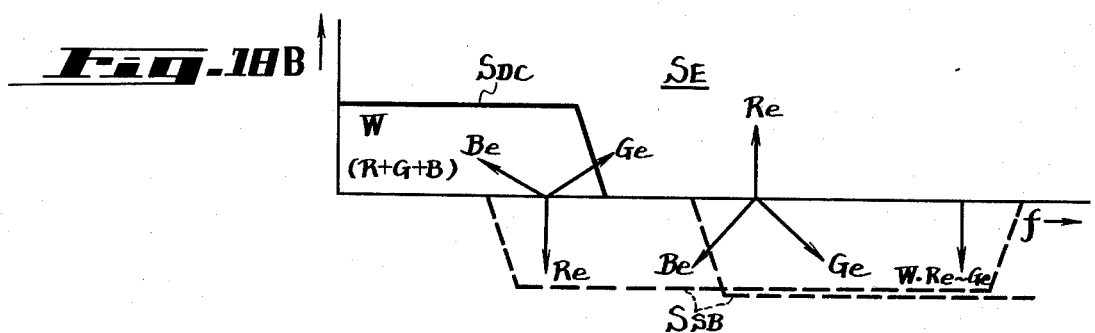
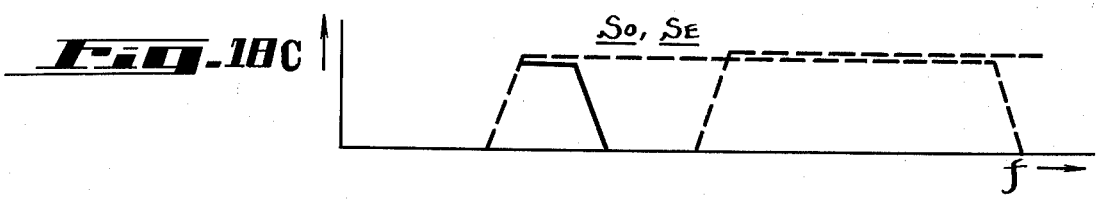
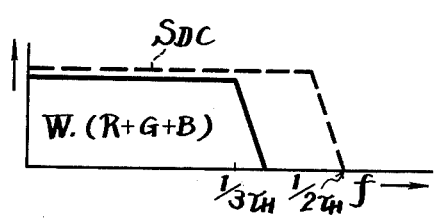
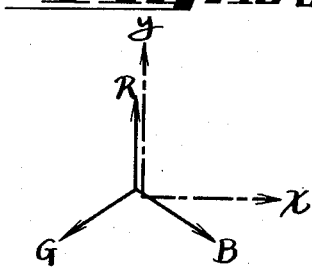

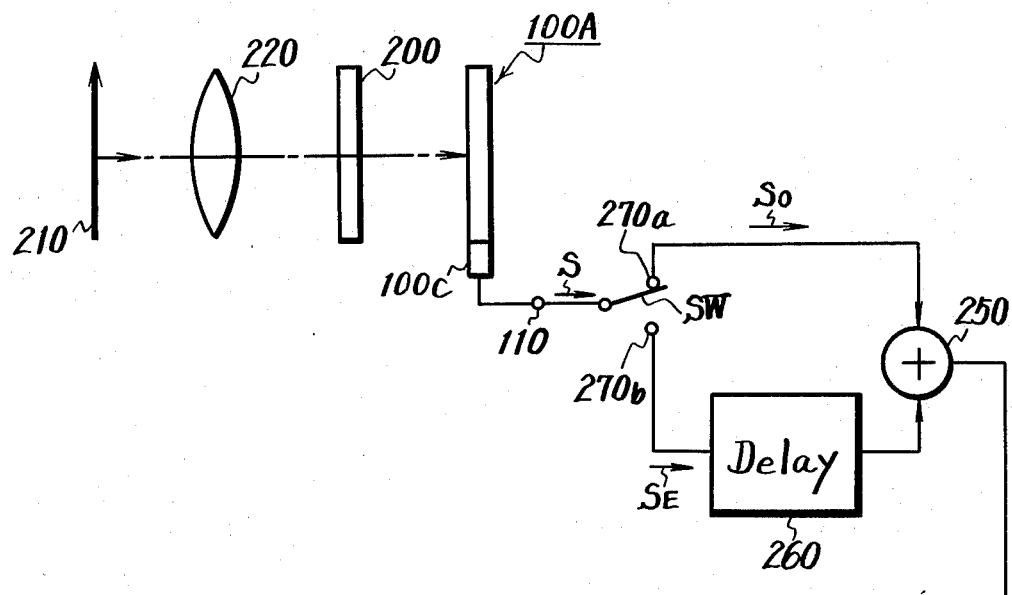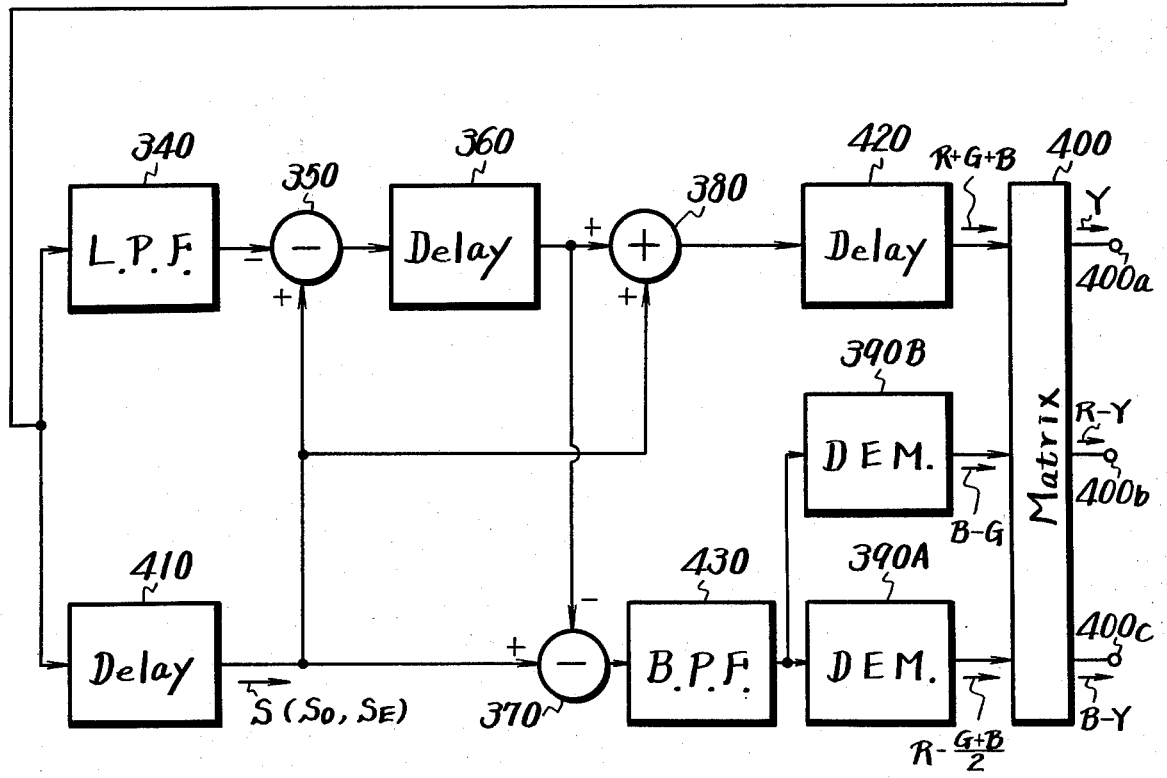
Fig. 11

SOLID STATE COLOR CAMERA

BACKGROUND OF THE INVENTION

1. Field of the Invention

The field of art to which this invention relates is solid-state cameras and in particular to solid-state color cameras which supply composite color video signals having interlaced relations between successive two fields.

2. Description of the Prior Art

In the case of using a solid state sensor such as a charge coupled device (hereinafter referred to as a CCD) as an image pickup device for a television camera, input photo or optical informations corresponding to the image of an object are converted to electrical signals in response to sampling at every picture element. So in contrast to well known vidicons, output signals are sampled in a CCD at every picture element. If it is assumed that the sampling frequency is $f_c$, the alignment pitch $\tau_H$ in the horizontal direction is $1/f_c$. The electric charges stored in the respective picture elements are finally transferred to an output terminal at a rate determined by a clock pulse frequency and the video information is derived in serial form. The resultant video signal $S_Y$ contains DC components $S_{DC}$ and side band components $S_{SB}$ of the sampling frequency $f_c$ modulated with the DC components $S_{DC}$.

The side band component $S_{SB}$ is distributed upper and lower with respect to the sampling frequency $f_c$ which is at its center. If the frequency band of the DC component $S_{DC}$ is selected sufficiently wide so as to increase the resolution, a higher band component $S_{DH}$ of the DC cmponent is superimposed with the side band component and hence a certain part thereof is caused to develop a sampling error. If a picture is reproduced from such a video signal, a flicker is caused in the resulting picture.

Since this flicker is caused by the sampling error, the sampling error and consequently the flicker can be avoided by restricting the frequency band of DC component $S_{DC}$ to be smaller than one-half of the sampling frequency $f_c$. However, if the frequency band of the DC component $S_{DC}$ is restricted as above, the resolution is deteriorated. In order to make the frequency band of the DC component $S_{DC}$ about 3.5 MHz without deteriorating the resolution, the sampling frequency $f_c$ may be made high enough. The sampling frequency $f_c$ is obtained by the product of $n.f_H$ ($f_c = n.f_H$) where $n$ is the number of picture elements in the horizontal direction of the CCD and $f_H$ is the horizontal frequency of the television signal (practically, an effective scanning time period in the horizontal direction). If the sampling frequency $f_c$ is made so high as to remove the sampling error, the number $n$ of the picture elements must be increased correspondingly, which then results in difficulty in the manufacturing of the CCD.

Further, if such a television camera is provided which handles color signals and produces composite color video signals taking an interlace at every field into account, the number of picture elements in the vertical direction increases and the system design becomes more difficult due to the above mentioned deterioration of signals caused by the signal process at every field.

SUMMARY OF THE INVENTION

According to an aspect of the present invention, a solid state color camera is provided which employs a solid state image sensing body such as a CCD or the like and a color filter of special structure. In the invention, in order to perform the interlace scanning system used in a standard television system, the solid state image sensing body is so driven and its output signal is so processed that the corresponding picture elements at even and odd fields are shifted in the vertical direction by one-half of the alignment pitch of picture elements. In addition to the determination of the picture elements described above, the structure of the color filter is determined to obtain the same color signal at the even and odd fields. Thus, the signals can be treated or processed in substantially the same manner in the even and odd fields.

Since the above expression "interlace system" as the scanning system is not so suited to the expression used in the camera employing the CCD, it will be referred to as a field (or frame) shift system in the following description. That is, the CCD is used in the present invention to produce an output video signal with a parallel-serial system, so that the areas corresponding to the respective horizontal scanning lines are not line-scanned and also are not face-scanned in the vertical direction. But, such a system is employed that induced electric charges based upon light informations of a light image of an object projected on an image sensing part (which will be described later) of the CCD are transferred at one time or such a transfer system is employed which transfers a so-called one field signal. In this case, the invention is applied to such a system in which fields are divided into an even field and an odd field and the video area at the even field is shifted by $\tau_H'/2$ from that at the odd field (one-field shift) to derive therefrom respective informations. The above system is also called a field-shift system.

With the invention, since in the signal process the video signals during the horizontal scanning period adjacent to the odd and even fields are added, so far as there is a vertical correlation in a sampling error caused in the modulated or DC component, the sampling error can be removed completely. As a result, the video signal obtained by the present invention can effectively eliminate flickers of the pictures and hence a stable and good picture can always be reproduced.

Since the sampling error can be removed completely by the invention, the following advantage is also performed. That is, in order to form a color camera without deteriorating the resolution with the prior art, it must be necessary that the band of a luminance signal (band of the DC component) is required to be more than 3.5 MHz and that, in order to suppress the production of any sampling error under the above condition, the number N of picture elements in the horizontal scanning direction must be more than 700. If the number N of picture elements is as great as in the prior art, the manufacturing of CCD becomes very difficult, which results in the fact that the CCD can not be produced at low cost. While, according to the present invention, since no sampling error is caused even though the band of the luminance signal is widened, even when the band can be selected to about 4.0 MHz, the number N of picture elements is about 400 which is sufficient. Therefore, the CCD can be manufactured inexpensively.

According to another aspect of the invention, a frequency-separation system can be employed upon separating the color signals.

Further, in a specific case a special invention is adopted in the arrangement of the sensing units of CCD.

These and other features and advantages of the present invention will be understood in greater detail from the following description and the associated drawings wherein reference numerals are utilized to designate a preferred embodiment.

BRIEF DESCRIPTION OF THE DRAWINGS

FIGS. 5A, 5B and 5C are waveform diagrams of driving pulse signals for the CCD;

FIG. 6 is a schematic view showing a part of a color filter preferable for use in the invention;

FIGS. 8A to 8E, inclusive, are frequency spectrum and vector diagrms used for explaining the operation of the solid state color camera shown in FIG. 7;

FIGS. 10A and 10B are frequency spectrum and vector diagrams used for explaining the operation of the solid state color camera in which the color filter shown in FIG. 9 is employed;

FIGS. 12A and 12B are frequency spectrum and vector diagrams used for explaining the operation of the solid state color camera in which the color filter shown in FIG. 11 is employed;

FIG. 17 is a schematic diagram showing the solid state color camera mentioned in connection with FIG. 16; and FIGS. 18A to 18E, inclusive, are frequency spectrum and vector diagrams used for explaining the solid state color camera of the invention shown in FIG. 17.

DESCRIPTION OF THE PREFERRED EMBODIMENTS

This invention will be hereinbelow described with reference to the drawings in which a 3-phase CCD is employed, by way of example, as a solid state image sensor.

Figure 1:
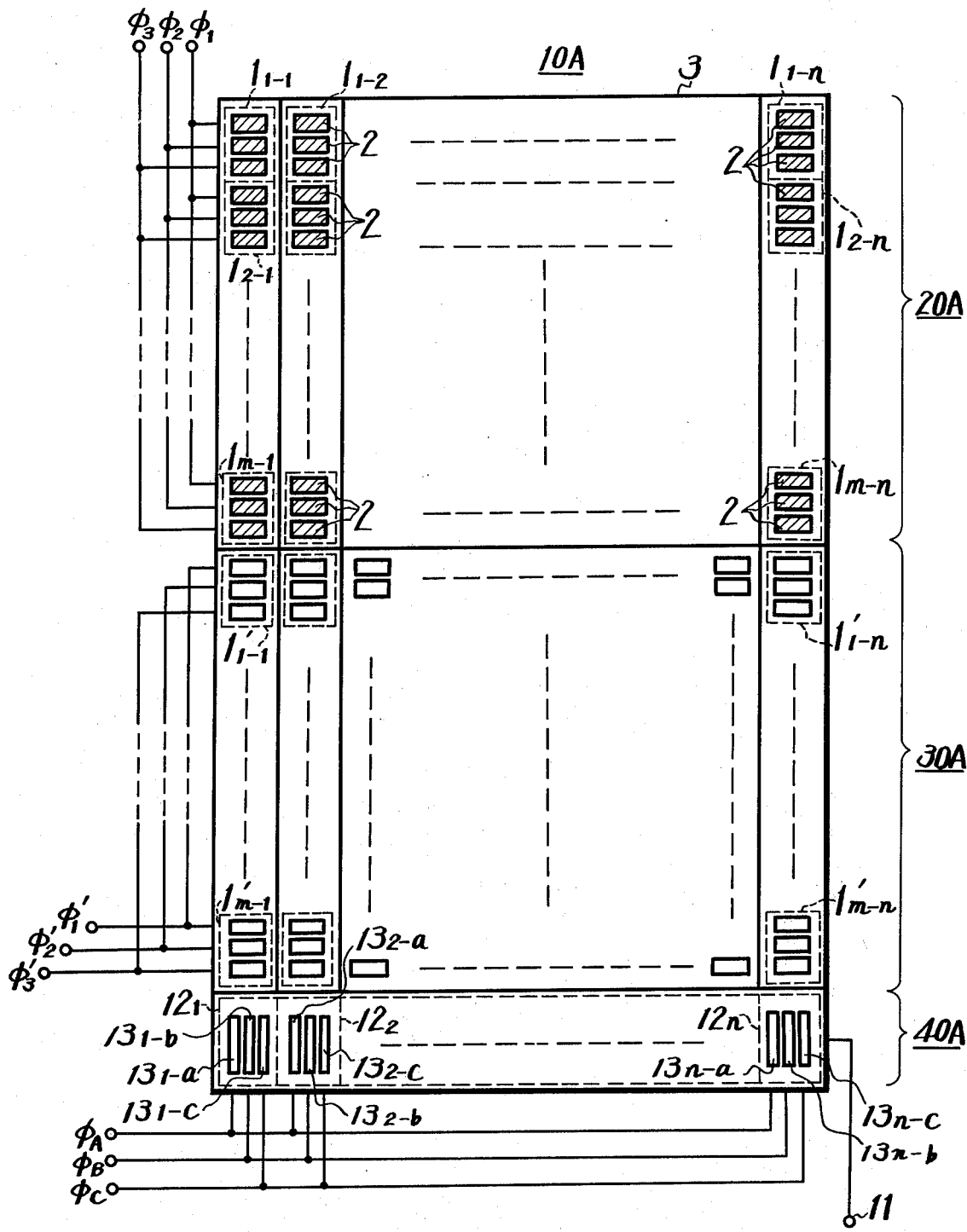
FIG. 1 is a view showing a solid state image sensor used in the invention.

In FIG. 1, reference numeral 10A designates a CCD. The CCD 10A consists of a photo-sensitive array 20A on which an image of an object (not shown in FIG. 1) is projected, a temporary storage array 30A which may store electric charges corresponding to input photo informations of the image from the photo sensitive array 20A, and a read-out register 40A for reading out an image signal. The photo-sensitive array 20A includes a predetermined number of picture elements $1_{1-1}, 1_{1-2}, \ldots 1_{m-n}$ which are arranged in the horizontal and vertical directions with a predetermined alignment pitches $\tau_H$ and $\tau_H'$, where $n$ and $m$ are positive integers. Each of the picture elements $1_{1-1}, 1_{1-2}, \ldots 1_{m-n}$ has three photo-sensing units 2 which are connected with three electrodes $\phi_1$, $\phi_2$ and $\phi_3$, respectively, to form the photo-sensitive array 20A of the 3-phase CCD 10A.

Figure 2:
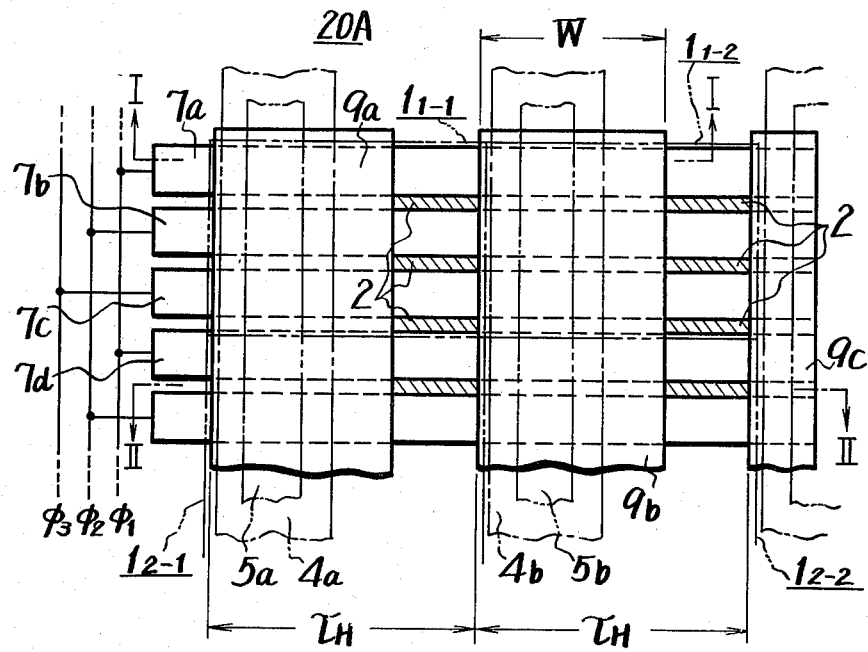
FIG. 2 is an enlarged view showing a part of the solid state image sensor shown in FIG. 1.
Figure 3A:
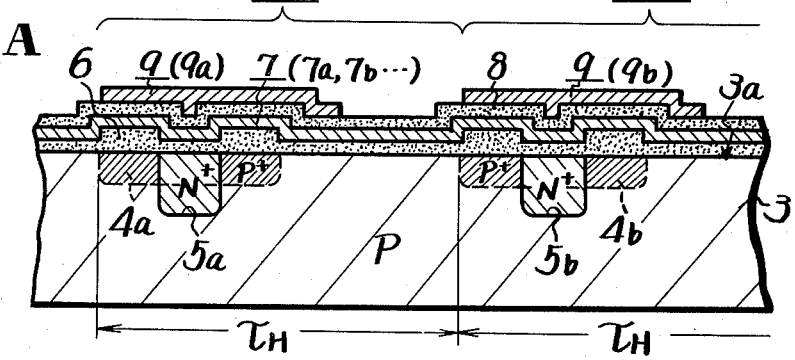
FIG. 3A is a cross-sectional view taken on the line I—I in FIG. 2.
Figure 3B:
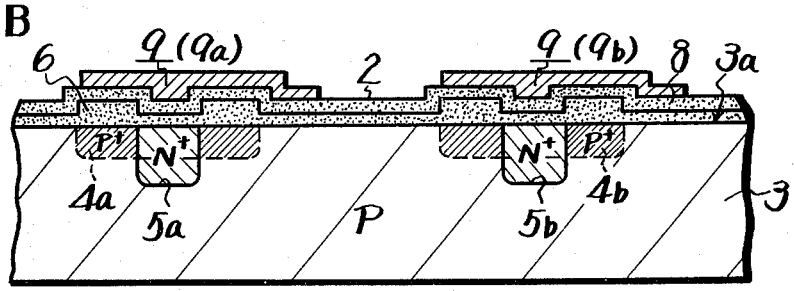
FIG. 3B is a cross-sectional view taken on the line II—II in FIG. 2.

FIGS. 2, 3A and 3B show a practical example of the photo-sensitive array 20A including the picture elements $1_{1-1}, 1_{1-2}, 1_{m-n}$.

In FIGS. 3A and 3B, a semiconductor substrate 3 is formed of, for example, a P-type conductivity. Regions 4a, 4b, ... are formed of the same conductivity type as that of the semiconductor substrate 3 but are different in impurity concentration with the alignment pitch $\tau_H$ as channel stops or stoppers. They are formed by the diffusion method from a major or top surface 3a of the semiconductor substrate 3. In the P-type regions 4a, 4b, ..., there are formed by the diffusion method over-flow drain regions 5a, 5b, ... so as to discharge excess electrons which may be produced in the substrate 3 surrounded by the P-type regions 4a, 4b, ... The conductivity type of the regions 5a, 5b is different from that of the substrate 3, or an N-type in the illustrated example. In FIGS. 3A and 3B, an insulating layer 6 made of $SiO_2$ or the like is formed on the top surface 3a and is used in the diffusion method mentioned above.

A conduction layer 7 which is made of, for example, aluminum serves as an electrode on the insulating layer 6, that is, a first conduction layer 7a, which intersects the channel stop 4a at right angles and has a predetermined width on the horizontal plane, is formed on the insulating layer 6 and a second conduction layer 7b, whose width is same as that of the first conduction layer 7a, is also formed on the insulating layer 6 parallel to the first conduction layer 7a with a predetermined distance from the latter. Similarly, plural conduction layers 7c, 7d, ... are formed on the insulating layer 6 sequentially and repeatedly with respect to the vertical direction of the photosensitive array 20A. In this case the total number of the conduction layers 7 (7a, 7b, 7c, 7d, ...) is selected to be three times the number of picture elements which may be easily understood from the fact that the CCD 10A is 3-phase one. Then, the groups of every third conduction layer (7a, 7d ...), (7b, 7e, ...), ... are electrically connected, and the electrodes $\phi_1$, $\phi_2$ and $\phi_3$ are led from the connected conduction layer groups, respectively, as shown in FIG. 1.

A metal layer 9, which is made of, for example, aluminum serves as an opaque body, and is formed with an insulating layer 8 made of $SiO_2$ or the like on the conduction layer 7. In this case, the metal layer 9 consists of a plurality of band-shaped strips 9a, 9b, ... each having a predetermined width W, extending in the vertical direction for covering at least each of channel stops 4a, 4b, ..., respectively, but not covering the channel stops belonging to the other channels, as shown in FIG. 2. Therefore, the cross hatched portions in FIG. 2 act as photo-sensing units 2 of the respective picture elements $1_{1-1}, 1_{1-2}, \ldots 1_{m-n}$. As shown in FIG. 3B, in the photo-sensing unit 2, there is no conduction layer 7 (7a, 7b, ...) blocking the top surface 3a of the semiconductor substrate 3.

With the photo-sensitive array 20A constructed as above, the input photo information of image of the object causes the induction of an electric charge in the semiconductor substrate 3 corresponding to the photo-sensing unit 2 which relates to any of the electrodes $\phi_1$, $\phi_2$ and $\phi_3$ which is supplied with an image-sensing pulse having a predetermined potential relation to the input photo information. Thus, if a well-known transfer clock pulse is applied to the electrodes $\phi_1$ to $\phi_3$, the electrical charge induced in each of the picture elements $1_{1-1}, 1_{1-2}, \ldots 1_{1-n}, \ldots 1_{2-1}, \ldots 1_{2-n}, \ldots 1_{m-1}, \ldots 1_{m-n}$ in the horizontal scanning lines can be transferred and stored in the temporary storage array 30A during the vertical blanking time in its corresponding horizontal scanning positions. To this end, the temporary storage array 30A is formed substantially the same as the photo-sensitive array 20A in construction, but it is of course necessary that the whole temporary storage array 30A is shielded from light, so that the parts of the temporary storage array 30A corresponding to those of the photo-sensitive array 20A are marked with the same reference numerals with a prime "'" added as shown in FIG. 1.

The charges stored in the temporary storage array 30A are sequentially read out with clock or sampling pulse applied to the read-out register 40A and then derived from a terminal 11 (FIG. 1) as the video signal $S_Y$. As shown in FIG. 1, the read-out register 40A comprises only read-out elements $12_1, 12_2, \ldots 12_n$ corresponding to the horizontal picture elements. In this case, the read-out is accomplished with sampling pulses $\phi_A$, $\phi_B$ and $\phi_C$ of 3-phases, so that the read-out elements $12_1, 12_2, \ldots 12_n$ have three read-out units $13_{1-a}, 13_{1-b}, 13_{1-c}; 13_{2-a}, 13_{2-b}, 13_{2-c}; \ldots; 13_{n-a}, 13_{n-b}, 13_{n-c}$, respectively.

Needless to say, other types of solid state image sensors, such as a photo diode array instead of CCDs could be used.

Figure 4A:
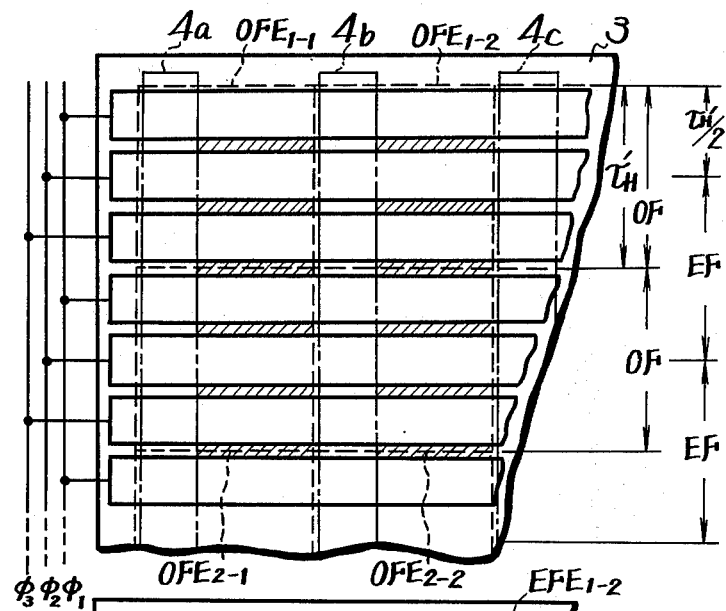
FIGS. 4A and 4B are partial enlarged plan views showing the relationship between picture elements and a semiconductor body in even and odd fields.
Figure 4B:
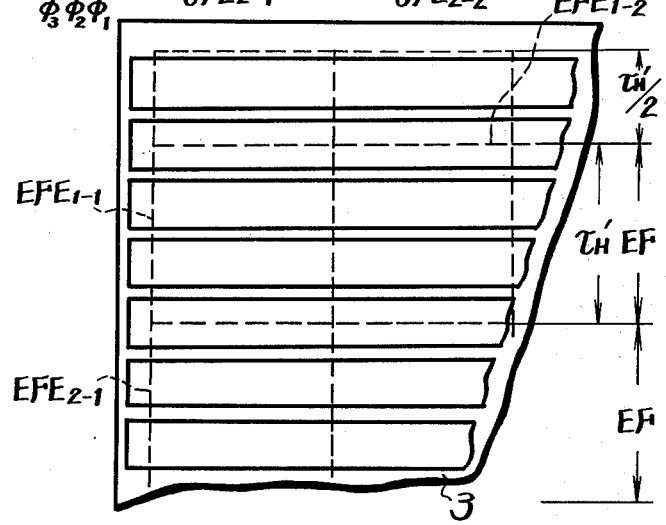

FIGS. 4A and 4B are schematic views used for explaining a manner to obtain video signals in odd and even fields which are interlaced with the utilization of the CCD shown in, for example, FIG. 2. If it is assumed that dotted-line block regions $OFE_{1-1}, OFE_{1-2}, \ldots OFE_{m-n}$ (not shown) in FIG. 4A are picture elements which form the odd field OF, picture elements $EFE_{1-1}, EFE_{1-2}, \ldots EFE_{m-n}$ (not shown) in the even field EF are shifted in position by $\tau_H'/2$ (where $\tau_H'$ is the alignment pitch of the picture elements in the vertical direction) from the picture elements $OFE_{1-1}, \ldots OFE_{m-n}$ in the vertical direction as shown in FIG. 4B. The picture elements $1_{1-1}, \ldots 1_{m-n}$ of the photo-sensitive array 20A shown in FIG. 1 just shows the positions of the picture elements at the odd field.

Since the CCD 10A is made as the field-shift system to pick up an object as described above, the above mentioned electrodes are supplied with driving pulse signals $S_1$, $S_2$ and $S_3$ (which consist of an image sensing pulse and a transfer clock pulse) which will be described later. As shown in FIGS. 5A, 5B and 5C, if the period of an odd field is taken as $N_A$ and that of an even field taken as $N_B$, an electric charge in response to the input light information is induced in the semiconductor substrate 3 beneath the electrode $\phi_1$ during the period $N_A$ and then read out electrically. While, during the following period $N_B$ electric charges are induced in the semiconductor substrate 3 beneath the electrodes $\phi_2$ and $\phi_3$ in response to the input light information, respectively, and then read out electrically.

To this end, the potential relationship among the image sensing pulses $S_{1A}$, $S_{2A}$ and $S_{3A}$ of the driving pulse signals $S_1$ to $S_3$ applied to the electrodes $\phi_1$ to $\phi_3$ is shown in FIGS. 5A to 5C. That is, only the pulse $S_{1A}$ is low in potential as compared with those of the pulses $S_{2A}$ and $S_{3A}$. With the image sensing pulse $S_{1A}$, the electric charge in response to the input light information is stored in the semiconductor substrate 3 beneath the electrode $\phi_1$. The stored electric charge is transferred to the lower part in the vertical direction within an instance with the transfer clock pulses $S_{1B}$, $S_{2B}$ and $S_{3B}$ which have a desired potential relationship thereamong with the transfer time of $\Delta T$ as shown in FIGS. 5A to 5C.

By the scanning during the period $N_A$, the contents of picture elements just shown in FIG. 4A are derived as the contents of informations.

The following period $N_B$ will be now described. During the period $N_B$, contrary to the above case, the image sensing pulses $S_{2A}$ and $S_{3A}$ of the driving pulse signals $S_2$ and $S_3$ are lowered in potential to induce electric charges in the semiconductor substrate beneath the electrodes $\phi_2$ and $\phi_3$. Upon transferring the electric charges, the electric charge induced in the semiconductor substrate 3 beneath the electrode $\phi_2$ is transferred at first to that beneath the electrode $\phi_3$ with the transfer clock pulse as shown in FIG. 5. Thereafter, the electric charge is further transferred with the transfer clock pulses $S_{1B}$ to $S_{3B}$ similar to the period $N_A$. As described above, if the storing position of electric charges in response to the input light information at the even field is shifted, the center of the picture element is of course shifted by $\tau_H'/2$ in the vertical direction from the case of the odd field. As a result, in this case the contents of picture elements shown in FIG. 4B are derived as the contents of informations and hence the field-shift scanning systems is carried out.

An embodiment of the solid state color camera according to the present invention will be hereinbelow described.

At first, an example of the color filter which is suitable for use in the present invention will be described with reference to FIG. 6. The color filter of this example comprised light-permeable or transparent parts which are divided into a plurality of sections in the vertical and horizontal directions, respectively. The respective light-permeable part is divided into two sections in the vertial direction to make same the respective color light components obtained at the even and odd fields. Accordingly, when the region corresponding to the odd horizontal scanning line in the even field is scanned, the color light contains main color light components and also a common color light component to the color light components which are obtained by scanning the region corresponding to the odd horizontal scanning line in the odd field or the color light components containing its all color light components.

As shown in FIG. 6, the color filter 20 has the light-permeable part on the odd scanning line which is provided in correspondence with the respective picture elements and are divided into two sections $2_{a1}, 2_{a1}'; 2_{a2}, 2_{a2}'; \ldots$. Color filter elements, which are repeatedly arranged as R-G-B-R-G-B- . . . (Red-Green-Blue-Red-Green-Blue- . . . ), are located on the upper sections of the divided sections, while their lower sections are made as white (W) filter elements or transparent ones.

Similarly, the light-permeable section on the even scanning line $4_b$ is divided into two sections $2_{b1}$, $2_{b1}'$; $2_{b2}$, $2_{b2}'$; ... whose upper sections are made as filter sections in the order of Cy-Mg-Ye-Cy-Mg-Ye-.... (Cyan-Magenta-Yellow-Cyan-Magenta-Yellow-....) and whose lower sections are made white (W) ones.

In the color filter 20 shown in FIG. 6, the common sections $2_{a1}'$, $2_{a2}'$; ..., $2_{b1}'$, $2_{b2}'$, ... are selected white (W) in passing-through light, but color lights (primary color lights or complementary color lights) other than the white color light can be useable as the passing-through light. The reason is that the filter selected so that the color light components obtained from the odd field are selected equal to those obtained from the even field, which will become apparent from the later description, so that even if the color lights other than white color light which meet the above purpose are selected, there occurs no problem in the signal process.

Figure 7:
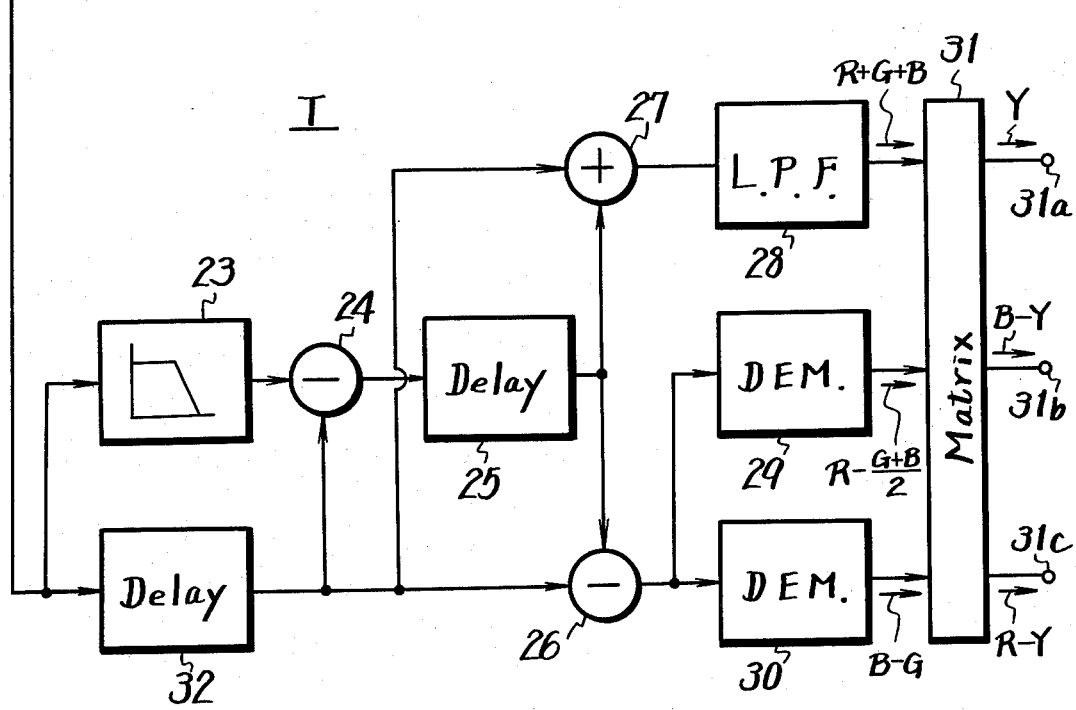
FIG. 7 is a schematic diagram showing an embodiment of the solid state color camera according to the invention.

An embodiment of the solid state color camera or signal treating or processing system according to the present invention, in which the color filter 20 shown in FIG. 6 is employed, will be now described with reference to FIGS. 7 and 8A to 8E. In FIG. 7, reference letter T designates a signal processing system preferred for use in the solid state color camera of the invention. The image of an object 21 is projected through an optical lens system 22 and along an optical path $l$ shown by the one-dot chain line on the photo-sensitive array 20A of the CCD 10A. In this case, the color filter described above 20 is located on the light or optical path $l$ of the object 21, so that the image of the object 21 projected on the photo-sensitive array 20A of the CCD 10A is color-separated. Therefore, a video signal S based upon the color separated image of the object 21 is obtained at the output terminal 11 of the CCD 10A. If it is assumed that the lights passed through the color filter 20 at the odd horizontal scanning period in the odd field are taken as R, G, B and W, a video signal $S_O$, which has the frequency spectra and the phase relationship among its color components shown in FIG. 8A, is obtained. The video signal $S_D$ contains a DC component $S_{DO}$ and a side band component $S_{SBO}$. In this case, since the white color W is not divided in its light-permeable section with respect to the horizontal scanning direction, the carrier frequency of the white color light W is $1/\tau_H = f_c$. White, during the even horizontal scanning period, the passed-through lights are Cy, Mg, Ye and W, so that a video signal $S_E$ shown in FIG. 8B is obtained. The video signal $S_E$ contains a DC component $S_{DE}$ and a side band component $S_{SBE}$. In this case, the phase relationship of its color components is reversed as compared with that of the color components at the even horizontal scanning period as shown in FIG. 8B.

Now, the even field is considered. In this case, the corresponding picture elements are shifted by $\tau_H'/2$ in the vertical direction only, so that the passed-through lights at the odd scanning period are Cy, Mg, Ye and W which are same as those obtained at the even scanning period in the odd field, while the passed-through lights at the even scanning period are R, G, B and W by the similar reason. Accordingly, the frequency spectra and phase relationship among the color components of video signals $S_O'$ and $S_E'$ at the even field are the same as those at the odd field.

The signal processing is achieved in consideration of the above fact. The video signal S (including the signal components $S_O$, $S_E$ and $S_O'$, $S_E'$) obtained at the output terminal 11 is supplied to a low pass filter 23 through which low band signal components of the signal S with the frequency of about 1.0 to 2.0 $MH_Z$ pass. The low band components from the low pass filter 23 and the signal S which is not restricted in band, are supplied together to a subtractor 24. Thus, the subtractor 24 produces an output signal which only contains high band components as shown in FIG. 8C and is fed to a delay circuit 25. The output signal from the delay circuit 25, which is delayed by a time corresponding to one horizontal scanning period, is supplied to a subtractor 26 and an adder 27, respectively.

Since the adder 27 is also supplied with the video signal which is not restricted in band and is not delayed, the color components are cancelled in the adder 27. Thus, the adder 27 produces an output signal shown in FIG. 8D. That is, the color components which are reverse in phase are cancelled by addition, so that a DC component $S_{DC}$ with no sampling error can be obtained through a low pass filter 28 connected to the output side of the adder 27.

On the other hand, since the subtractor 26 is also supplied with the video signal S, which is not delayed, together with the delayed signal from the delay circuit 25, the DC component $S_{DC}$ and the side band components of the white light W, which are same in phase, are cancelled in the subtractor 26. Thus, the color components are only derived from the subtractor 26. Therefore, if the color components from the subtractor 26 are supplied to demodulators 29 and 30 respectively which have suitable demodulating (detecting) axes, phased color components can be demodulated. By way of example, if the demodulating axis of the demodulator 29 is selected as y-axis as shown in FIG. 8E, the color component of $R-(C+B/2)$ is demodulated by the demodulator 29. Similarly, if the demodulating axis of the demodulator 30 is selected as x-axis as shown in FIG. 8E, which demodulator 30 is supplied with the output from the subtractor 26, the color component of B-G can be demodulated by the demodulator 30. Accordingly, if the color components from the demodulators 29 and 30 and the above DC component passed through the low pass filter 28 are supplied to a matrix circuit 31, the phased video signals can be obtained at output terminals 31a, 31b and 31c and led out from the matrix circuit 31. For example, the luminance signal Y and the color difference signals B-Y, R-Y of NTSC system can be obtained at the output terminals 31a to 31c. In FIG. 7, reference numeral 32 designates a delay circuit which serves to compensate for the time delay caused by the low pass filter 23.

In the above example of the invention, as an example of the color filter which avoids the phenomenon that the color separation becomes impossible due to the field-shift scanning, the color filter 20 is exemplified in FIG. 6. However, other color filters than the color filter 20 can be used. Therefore, some color filters which can be employed in the invention will be now described.

Figure 9:
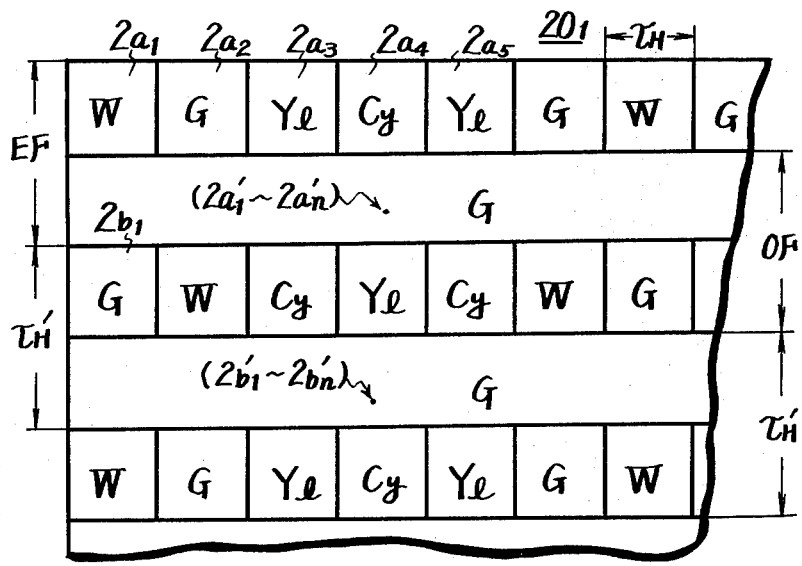
FIG. 9 is a schematic diagram showing a part of another color filter which can be also used in the invention.

FIG. 9 shows one of the color filters useable in the invention. The color filter $20_1$ shown in FIG. 9 is a type which may separate color components in the frequency separation manner, fundamentally. With the color filter $20_1$, the green color light G affecting the resolution is obtained from all over the color filter $20_1$, and the red color light R and blue color light B are restricted in band to a band (500 – 1000 $KH_Z$) or a narrow band which has no effect on the resolution by utilization of an optical low pass filter (not shown). In addition, in order to make it possible to separate the red and blue color lights R and B in view of frequency, the color lights of W-G-Ye-Cy-Ye-G are selected as a set and repeatedly arranged in the odd horizontal period, while the color lights of G-W-Cy-Ye-Cy-W are selected as a set and repeatedly arranged in the even horizontal period. With such a filter arrangement, since the red color light R is obtained at every second light-permeable section, its carrier frequency becomes $\frac{1}{2} \tau_H (= \frac{1}{2} f_c)$. While, since the blue color light B is obtained at every third light-permeable section, its carrier frequency becomes $\frac{1}{3} \tau_H (= \frac{1}{3} f_c)$. As a result, it may be apparent that both the color light components can be separated in view of frequency.

The color filter $20_1$ is divided into two sections similar to the foregoing example and the sections between the divided two sections are selected so that the green color G passes as permeable light therethrough.

If an object is picked up by the solid state color camera, in which the just above mentioned color filter $20_1$ is employed, in the filed-shift manner, the produced video signals S (signals $S_O$, $S_E$ and $S_O'$, $S_E'$) have the frequency spectra and the phase relationship among their color components as shown in FIGS. 10A and 10B. As may be apparent from FIGS. 10A and 10B, the solid state color camera using the color filter $20_1$ shown in FIG. 9 can perform the same effect as that using the color filter 20 shown in FIG. 6.

Figure 11:
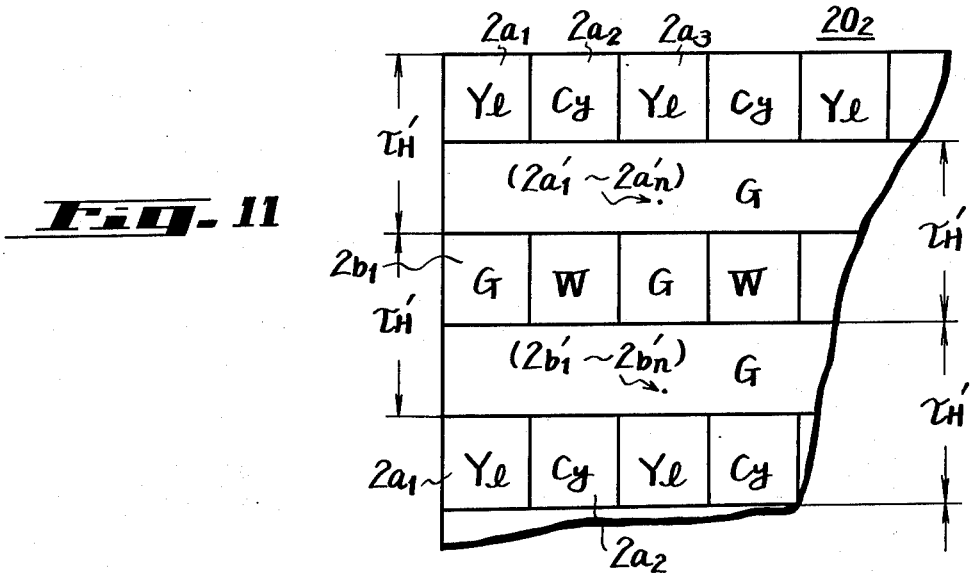
FIG. 11 is a schematic diagram showing a part of a still further example of the color filter which is useable in the invention.

FIG. 11 shows a third example of the color filter useable in the invention. A color filter $20_2$ shown in FIG. 11 is an example which belongs to the phase separation system. In the color filter $20_2$, the red and blue color lights R and B are selected as narrow band characteristics, the selected sections and their arrangement are Ye-Cy-Ye and G-W-G and the section between the above two sections is selected green G in its permeable light, as shown in FIG. 11.

FIGS. 12A and 12B show the frequency spectra and phase relationship of the video signals S (signals $S_O$, $S_E$ and $S_O'$, $S_E'$) obtained by the solid state color camera using the color filter $20_2$ shown in FIG. 11.

Figure 13:
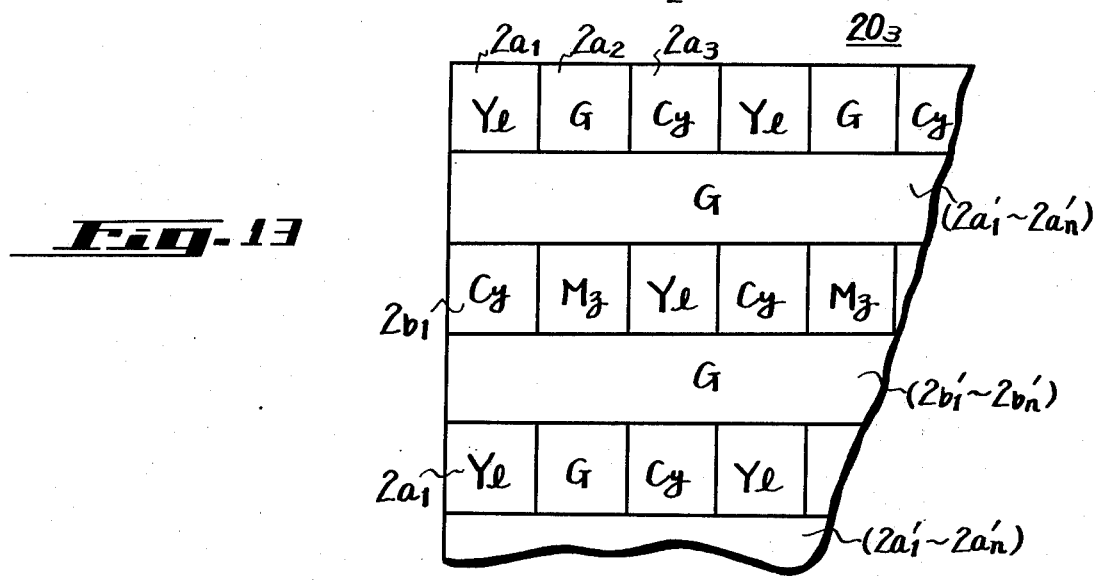
FIGS. 13 and 14 are schematic diagrams showing parts of further examples of the color filter which are useable in the invention.
Figure 14:
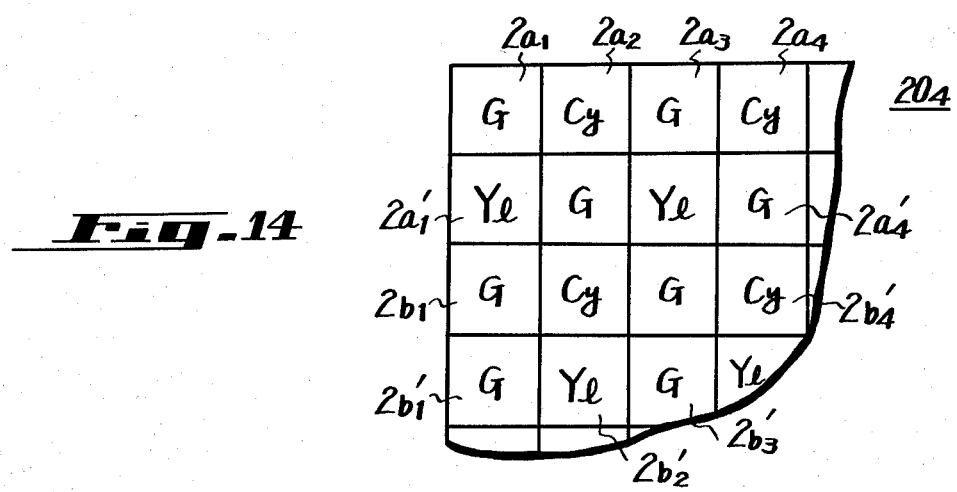

FIGS. 13 and 14 respectively show further examples of the color filter usable in the invention with similar effects in which the parts of the color filters $20_3$ and $20_4$ corresponding to those of the above examples 20 to $20_2$ are marked with the same reference numerals and letters.

Figure 15:
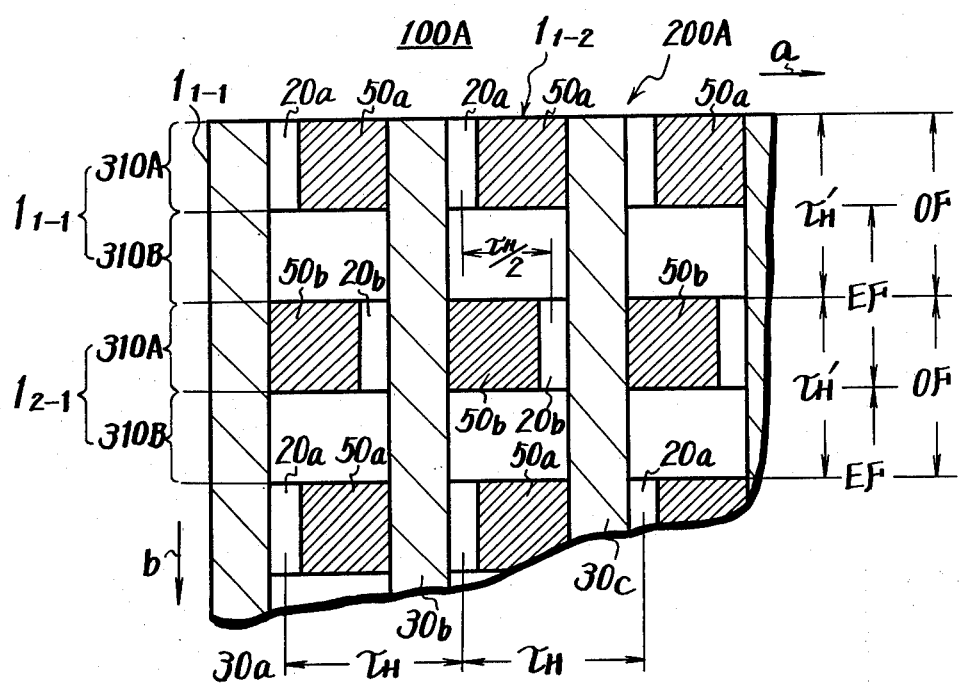
FIG. 15 is a plan view showing a part of another CCD which is useable in the invention.

FIG. 15 shows another example of the solid state image sensor which is used in the invention. The solid state image sensor or CCD 100A shown in FIG. 15 has an image sensing array 200A.

Figure 16:
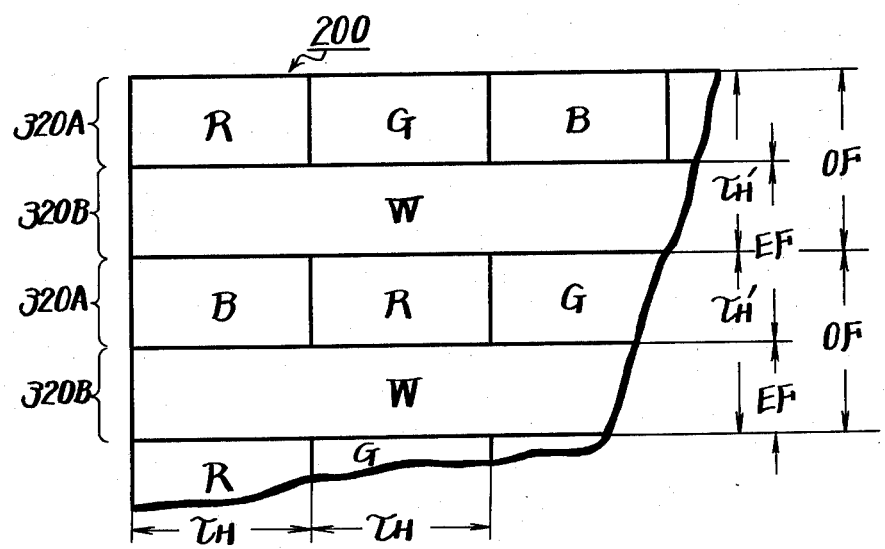
FIG. 16 is a plan view showing a part of the color filter which is used in a further example of the solid state color camera of the invention together with the CCD shown in FIG. 15.

FIG. 16 shows a still further example of the color filter usable in the invention.

Before describing a solid state color camera using the CCD 100A shown in FIG. 15 and the color filter 200 shown in FIG. 16, the CCD 100A will be described in detail with reference to FIG. 15.

As shown in FIG. 15, with the CCD 100A, each of the picture elements $1_{1\text{-}1}$ to $1_{m\text{-}n}$ (not shown) is divided into two areas with respect to the vertical scanning direction. In one area, one section or an upper half section 310A thereof is restricted in its image sensing region, while the other section or lower half section 310B thereof is opened all over its image sensing region in the illustrated example. That is, the parts 50a and 50b with hatches in FIG. 15 show light shielding parts. In FIG. 15, reference numerals 30a, 30b, . . . show channel stops, respectively.

Photo-sensing units 20a, 20b, . . . in the upper half section 310A of the respective picture elements are located in such a position that the phase is reversed at every line.

The color filter 200 disposed in front of the CCD 100A is divided into two parts with respect to the vertical direction, as shown in FIG. 16, similar to the CCD 100A. Its one divided part 320A corresponding to the photo-sensing units 20a, 20b or upper half section 310A is selected to have color-permeability for passing therethrough desired primary color lights, while its other divided part (common part) 320B is selected to pass a color light common to the horizontal scanning direction. If the color filter 200 is divided into two parts as described above, an odd field OF is shifted by $\tau_H'/2$ from an even field EF in the photo-sensing area only. Therefore, based upon the fact that the part or common part 320A is provided common to the respective fields OF and EF, the color components obtained from the respective fields coincide with each other. By way of example, the selection of the color lights is achieved such that, in the odd horizontal scanning period, the color lights of R-G-B-R-G-B are repeated in correspondence with the part 320A divided in each picture element, while in the even horizontal scanning period there is provided the phase difference of 180° between the above repeating of the color lights and the repeating of the latter or the color lights of B-R-G-B-R-G are repeated as shown in FIG. 16. The white light (transparent) W is selected as a passing-through light in the common part 320B. However, another color light such as, for example, green color light G can be selected instead of the white color The description of a signal necessary for interlace-driving the CCD 100A will be omitted because it has been described already in connection with the foregoing example.

The second embodiment of the solid state color camera according to the invention, in which the CCD 100A and the color filter 200 are employed, will be described with reference to FIG. 17. With the embodiment of FIG. 17, the image of an object 210 is projected through an optical lens system 220 and the color filter 200 on the CCD 100A, and its read-out register 100C accomplishes reading out of video signals S. The video signal S (signals $S_O$, $S_E$) delivered to an output terminal 110 connected to the read-out register 100C is supplied to an adder 250 through a switch SW which is reversed at every one horizontal scanning period to achieve the signal treatment or process.

Since the distance of $\tau_H/2$ is provided between the image sensing units 20a and 20b of the odd and even periods as shown in FIG. 15, if video signals $S_O$ and $S_E$ in the odd and even periods are read out sequentially, it may be thought that the phase difference of 180° exists between the video signals $S_O$ and $S_E$. Although its detailed description will be omitted, the depletion layers produced in the semiconductor substrate with the image sensing pulses applied to the electrodes $\phi_1$ to $\phi_3$ provided in the semiconductor substrate under the image sensing units extend to or is produced all over the divided regions in addition to the parts under the image sensing units 20a and 20b, so that even though both the video signals $S_O$ and $S_E$ are shifted by $\tau_H/2$ specially, they have the same phase relative to the time of transfer and read out.

Therefore, in the embodiment of FIG. 17, in order to shift the video signal $S_O$ by $\tau_H/2$ or 180° in phase in view of time, after the video signal $S_E$ in the odd field is delayed by a delay circuit 260, the video signal $S_E$ is supplied to the adder 250. That is, when the switch SW is changed over and contacts one fixed contact point 270a, the video signal $S_O$ in the odd period is supplied to the adder 250.

The frequency spectra and phase relationships of the video signals $S_O$ and $S_E$ supplied to the adder 250 are shown in FIGS. 18A and 18B, respectively.

FIG. 18A shows those of the video signal $S_O$. In this case, the carrier frequencies of the color light components R to B are $\frac{1}{3}\tau_H$ and the phase difference of 120° exists among them, so that the phase relationships shown in the figure in satisfied. The white color light W is not changed any in the common section 320B, so that its carrier frequency is $1/\tau_H$.

FIG. 18B shows the case of the video signal $S_E$. In this case, since the CCD 100A is so formed that the video signal $S_E$ has the phase difference of 180° from the video signal $S_O$, the side band components $S_{SB}$ at the frequencies of $\frac{1}{3}\tau_H$ and $1/\tau_H$ are obtained reversed in phase.

It will be easily understood from the foregoing description that the phase relationships mentioned above never change for odd and even fields.

Thus, the video signals $S_O$ and $S_E$, which are obtained sequentially and alternately at every horizontal scanning period, are supplied to a low pass filter 340 which passes therethrough the low band components with the frequency from 1.0 to 2.0 MH$_Z$. The low band components therefrom and the video signals $S_O$ and $S_E$, which are not restricted in band, are both supplied to a subtractor 350, so that the subtractor 350 produces an output signal containing only a high band component shown in FIG. 18C. The high band component from the subtractor 350 is fed to a delay circuit 360 to be delayed by one horizontal scanning period. The delayed signal from the delay circuit 360 is supplied to a subtractor 370 and an adder 380, respectively.

Since the adder 380 is also supplied with the video signal S which is not restricted in band and is not delayed, the color components are cancelled in the adder 380 and hence it produces only the DC component $S_{DC}$, as shown in FIG. 18D. That is, the color components reversed in phase are cancelled by adding them together and hence the DC component $S_{DC}$, which contains no sampling error, can be obtained.

While, the subtractor 370 is supplied with the delayed signal from the delay circuit 360 and also with the video signal S which is not delayed, so that the DC components $S_{DC}$ same having the phase are cancelled therein and only color components are obtained from the subtractor 370. The color components from the subtractor 370 is fed through a band pass filter 430 to demodulators 390A and 390B, which have suitable demodulating (detecting) axes, respectively, for demodulating aimed color components. By way of example, if the demodulating axis of the demodulator 390A is selected as y-axis (refer to FIG. 18E), the color component of R−(G+B/2) can be demodulated thereby. Similarly, if the demodulating axis of the demodulator 390B is selected as x-axis (refer to FIG. 18E), the color component of B-G can be demodulated thereby. Thus, if these color components and the above mentioned DC component are supplied to a matrix circuit 400, desired video signals can be obtained at output terminals 400a, 400b and 400c, respectively. For example, the luminance signal Y and color difference signals R-Y and B-Y of the NTSC system can be obtained at the output terminals 400a to 400c.

In FIG. 17, reference numeral 410 designates a delay circuit which serves to compensate for the time delay caused by the low pass filter 340, and reference numeral 420 designates a delay circuit which is provided for the similar view point to the former.

As described above, with the present invention the specific color filter is used to eliminate the defects caused by the interlace scanning system. In detail, in order to resolve the problem that the separation of the color components can not be performed by the interlace scanning, the color filter is so formed that the video signals having the same color component with respect to the odd field OF and even field EF can be obtained. By forming the color filter described as above, the color components in the even field EF can be separated by the similar manner that the color components in the odd field OF are separated.

It will be apparent that many modifications and variations could be effected by one skilled in the art without departing from the spirits or scope of the novel concepts of the present invention.

I claim as my invention:

1. A solid state color camera comprising:
   a solid state image sensing body having a plurality of picture elements aligned in both horizontal and vertical directions, each of said picture elements being composed of a plurality of sensing units aligned in the vertical direction;
   first read-out means for reading out during a first field interval first image signals corresponding to said picture elements;
   second read-out means for reading out during a second field interval second image signals corresponding to picture element areas which are composed of lower halves of said first named picture elements on alternate lines and upper halves of said first named picture elements on the lines between said alternate lines;
   color filter means disposed in a light path of an image object to be projected on said solid state image sensing body, and said color filter means being arranged such that output signals from said first and second read-out means can be decoded to obtain various color signal components; and said color filter means is so arranged that color signal components in image signals obtained from adjacent scanning lines in respective fields have a phase relationship of 180°.

2. A solid state color camera according to claim 1 further comprising signal processing means for producing a luminance signal component of the image object by adding image signals obtained from the adjacent scanning lines in the respective fields.

3. A solid state color camera according to claim 1, in which said filter means comprises upper and lower halves relative to said first named picture elements.

4. A solid state color camera according to claim 3, in which the upper halves of said color filter means have no spacial frequency with respect to the horizontal direction but the lower halves thereof have a spacial frequency for predetermined color components with respect to the horizontal direction.

5. A solid state color camera according to claim 4, in which said first named picture elements are divided into upper and lower halves corresponding with said color filter means, and the upper halves of said first named picture elements are shifted at their center by 1/2 of the horizontal alignment pitch of the picture elements each line.

6. A color coding filter for use with an imaging device for converting light into electrical signals using multiple-field format, the imaging device having a sense surface divided into a rectilinear array of cells distinctive for each field with the cells defining a grid pattern in each field and the cell boundaries in successive fields being vertically displaced by 1/2 the vertical alignment pitch to form overlapping grid patterns in successive fields, said filter comprising a plurality of rectilinear zones which are arranged in positions corresponding to the cell array of the sensing surface so that a light image falling on the sensing surface passes through said filter said filter having the first and fifth rows of said rectilinear zones formed in the pattern of white green yellow, cyan, yellow green, and third and seventh rows formed in the pattern of green, white, cyan, yellow, cyan, white, the other rows of said filter formed of strips for passing green color components.

7. A color coding filter for use with an imaging device for converting light into electrical signals using multiple-field format, the imaging device having a sensing surface divided into a rectilinear array of cells distinctive for each field with the cells defining a grid pattern in each field and the cell boundaries in successive fields being vertically displaced by 1/2 the vertical alignment pitch to form overlapping grid pattern in successive fields, said filter comprising a plurality of rectilinear zones which are arranged in positions corresponding to the cell array of the sensing surface so that a light image falling on the sensing surface passes through said filter, said filter having the first and all alternate rows of said rectilinear zones formed in the pattern of green, cyan and the other rows of said formed in the pattern yellow green.

8. A color coding filter for use with an imaging device for converting light into electrical signals using multiple-field format, the imaging device having a sensing surface divided into a rectilinear array of cells distinctive for each field with the cells defining a grid pattern in each field and the cell boundaries in successive fields being vertically displaced by 1/2 the vertical alignment pitch to form overlapping grid pattern in successive fields, said filter comprising a plurality of rectilinear zones which are arranged in positions corresponding to the cell array of the sensing surface so that a light image falling on the sensing surface passes through said filter, said filter having the first, fifth, and ninth rows of said rectilinear zones formed in the pattern of yellow, cyan, the third, seventh and eleventh rows formed in the pattern of green, white, and the remaining rows passing green color components.

9. A color coding filter for use with an imaging device for converting light into electrical signals using multiple-field format, the imaging device having a sensing surface divided into a rectilinear array of cells distinctive for each field with the cells defining a grid pattern in each field and the cell boundaries in successive fields being vertically displaced by 1/2 the vertical alignment pitch to form overlapping grid pattern in successive fields, said filter comprising a plurality of rectilinear zones which are arranged in positions corresponding to the cell array of the sensing surface so that a light image falling on the sensing surface passes through said filter said filter having the first, fifth and ninth rows of said rectilinear zones each formed in the pattern of yellow, green, cyan, the third, seventh and eleventh rows each formed in the pattern of cyan, magenta, yellow and the remaining rows passing green color components.

10. A color coding filter for use with an imaging device for converting light into electrical signals using multiple-field format the imaging device having a sensing surface divided into a rectilinear array of cells distinctive for each field with the cells defining a grid pattern in each field and the cell boundaries in successive fields being vertically displaced by 1/2 the vertical alignment pitch to form overlapping grid pattern in successive fields, said filter comprising a plurality of rectilinear zones which are arranged in positions corresponding to the cell array of the sensing surface so that a light image falling on the sensing surface passes through said filter, said filter having the first, fifth, and ninth rows of said rectilinear zones each formed in the pattern red, green, the third, seventh, and eleventh rows each formed in the pattern cyan, magenta, yellow and the remaining rows passing white light.

11. A color coding filter for use with an imaging device for converting light into electrical signals using multiple-field format, the imaging device having a sensing surface divided into a rectilinear array of cells distinctive for each field with the cells defining a grid pattern in each field and the cell boundaries in successive fields being vertically displaced by 1/2 the vertical alignment pitch to form overlapping grid pattern in succesive fields, said filter comprising a plurality of rectilinear zones which are arranged in positions corresponding to the cell array of the sensing surface so that a light image falling on the sensing surface passes through said filter, said filter having the first, fifth and ninth rows of said rectilinear zones being red, green, blue, the third, seventh and eleventh rows being blue, red, green and the remainder white.

* * * * *